(12) United States Patent
Japp et al.

(10) Patent No.: US 7,429,789 B2
(45) Date of Patent: Sep. 30, 2008

(54) FLUOROPOLYMER DIELECTRIC COMPOSITION FOR USE IN CIRCUITIZED SUBSTRATES AND CIRCUITIZED SUBSTRATE INCLUDING SAME

(75) Inventors: Robert M. Japp, Vestal, NY (US); Voya R. Markovich, Endwell, NY (US); Kostas I. Papathomas, Endicott, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 242 days.

(21) Appl. No.: 11/390,386

(22) Filed: Mar. 28, 2006

(65) Prior Publication Data
US 2006/0180936 A1  Aug. 17, 2006

Related U.S. Application Data

(63) Continuation-in-part of application No. 10/812,890, filed on Mar. 31, 2004, now Pat. No. 7,078,816.

(51) Int. Cl.
*H01L 21/31* (2006.01)
*H01L 23/48* (2006.01)

(52) U.S. Cl. .................. 257/705; 257/634; 257/702; 257/758; 257/E21.261; 257/E21.273; 428/32.85; 428/34.2

(58) Field of Classification Search ............... 257/634, 257/701, 705, 758
See application file for complete search history.

(56) References Cited

U.S. PATENT DOCUMENTS

| | | | |
|---|---|---|---|
| 3,953,566 A | 4/1976 | Gore | |
| 4,187,390 A | 2/1980 | Gore | |
| 4,482,516 A | 11/1984 | Bowman et al. | |
| 4,634,631 A | 1/1987 | Gazit et al. | |
| 4,849,284 A | 7/1989 | Arthur et al. | |
| 5,055,342 A | 10/1991 | Markovich et al. | |
| 5,126,192 A | 6/1992 | Chellis et al. | |
| 5,418,689 A | 5/1995 | Alpaugh et al. | |
| 5,652,055 A | 7/1997 | King et al. | |
| 6,207,595 B1 | 3/2001 | Appelt et al. | |
| 6,323,436 B1 | 11/2001 | Hedrick et al. | |
| 6,528,145 B1 | 3/2003 | Berger et al. ................. | 428/156 |
| 2003/0203174 A1 | 10/2003 | McCarthy et al. ........... | 428/209 |

*Primary Examiner*—Dao H Nguyen
(74) *Attorney, Agent, or Firm*—Hinman, Howard & Kattell LLP; Mark Levy; Lawrence R. Fraley

(57) ABSTRACT

A dielectric composition for forming a dielectric layer usable in circuitized substrates such as PCBs, chip carriers and the like, the composition including at least two fluoropolymers and two inorganic fillers. A circuitized substrate including at least one such dielectric layer and at least one conductive layer thereon is also provided.

19 Claims, No Drawings

`US 7,429,789 B2`

FLUOROPOLYMER DIELECTRIC COMPOSITION FOR USE IN CIRCUITIZED SUBSTRATES AND CIRCUITIZED SUBSTRATE INCLUDING SAME

CROSS-REFERENCE TO CO-PENDING APPLICATIONS

In Ser. No. 10/812,890, entitled, "Circuitized Substrate, Method Of Making Same, Electrical Assembly Utilizing Same, And Information Handling System Utilizing Same", filed Mar. 31, 2004 (inventors: R. Japp et al), there is defined a circuitized substrate, electrical assembly and information handling system capable of utilizing dielectric layers made using the dielectric composition taught herein. A method of making the substrate is also defined in this application. Ser. No. 10/812,890 is now U.S. Pat. No. 7,078,816.

In Ser. No. 10/812,889, entitled "Dielectric Composition For Forming Dielectric Layer For Use In Circuitized Substrates", also filed Mar. 31, 2004 (inventors R. Japp et al), there is defined a dielectric composition which forms a dielectric layer usable in circuitized substrates such as PCBs, chip carriers and the like. As such a layer, it includes a cured resin material and a predetermined percentage by weight of particulate fillers, thus not including continuous fibers, semi-continuous fibers or the like as part thereof. Ser. No. 10/812,889 is now U.S. Pat. No. 7,270,845.

In Ser. No. 10/920,235, entitled "Low Moisture Absorptive Circuitized Substrate, Method Of Making Same, Electrical Assembly Utilizing Same, And Information Handling System Utilizing Same", filed Aug. 18, 2004 (inventors: I. Memis et al), there is defined a circuitized substrate comprising a first layer comprised of a dielectric material including a low moisture absorptive polymer resin in combination with a nodular fluoropolymer web encased within the resin, the resulting dielectric layer formed from this combination not including continuous or semi-continuous fibers as part thereof. The substrate further includes at least one circuitized layer positioned on the dielectric first layer. An electrical assembly and a method of making the substrate are also provided, as is an information handling system (e.g., computer) incorporating the circuitized substrate of the invention as part thereof. Ser. No. 10/920,235 is now U.S. Pat. No. 7,145,221.

In Ser. No. 11/086,323, entitled "Low Moisture Absorptive Circuitized Substrate, Method Of Making Same, Electrical Assembly Utilizing Same, And Information Handling System Utilizing Same", filed Mar. 23, 2005 (inventors: I. Memis et al), there is defined a circuitized substrate including a composite layer including a first dielectric sub-layer including a plurality of fibers having a low coefficient of thermal expansion and a second dielectric sub-layer of a low moisture absorptivity resin, the second dielectric sub-layer not including continuous or semi-continuous fibers or the like as part thereof. The substrate further includes at least one electrically conductive layer as part thereof. An electrical assembly and a method of making the substrate are also provided, as is an information handling system (e.g., computer) incorporating the circuitized substrate of the invention as part thereof.

The present application is a continuation-in-part application of Ser. No. 10/812,890 filed Mar. 31, 2004, now U.S. Pat. No. 7,078,816.

All of the above applications are assigned to the same Assignee as the present application.

TECHNICAL FIELD

This invention relates to dielectric compositions for use in circuitized substrates such as those utilized in printed circuit boards (hereinafter also referred to as PCBs), chip carriers and the like, including such compositions which may be used individually or in combination with a supporting structure such as fiber-glass cloth or the like, which serve to form dielectric layers that can be used as part of such substrates, e.g., as electrically insulative layers between electrically conductive layers such as signal, power and ground layers which form part of the final structure. Even more particularly, the invention relates to such compositions that will assure such products will be able to include highly dense circuitry in such conductive layers.

BACKGROUND OF THE INVENTION

Printed circuit boards, laminate chip carriers, and the like (referred to herein also as circuitized substrates) used in many of today's technologies must permit the formation of multiple circuits in a minimum volume or space. As indicated above, these end products typically comprise a "stack" of layers of signal, ground and/or power planes (lines) separated from each other by at least one layer of dielectric material. The circuit lines or pads, e.g., those of the signal planes, are often in electrical contact with each other by plated holes passing through the dielectric layers. The plated holes are often referred to as "vias" if internally located, "blind vias" if extending a predetermined depth within the board from an external surface, or "plated-thru-holes" (hereinafter also referred to simply as PTHs) if extending substantially through the board's full thickness. By the term "thru-hole" as used herein is meant to include all three types of such board openings.

Product complexity has increased significantly over the past few years. For example, PCBs for mainframe computers may have as many as thirty-six layers of circuitry or more, with the complete stack having a thickness of as much as about 0.250 inch (250 mils). These boards are typically designed with three or five mil wide signal lines and twelve mil diameter thru-holes. For increased circuit densification in many of today's products such as PCBs, chip carriers and the like, the industry desires to reduce signal lines to a width of two mils or less and thru-hole diameters to two mils or less. Most known commercial procedures, especially those of the nature described herein, are incapable of economically forming the dimensions desired by the industry. Known processes for fabricating PCBs, chip carriers and the like typically comprise fabrication of separate innerlayer circuits (circuitized layers), which are formed by coating a photosensitive layer or film over a copper layer of a copper clad innerlayer base material. The photosensitive coating is imaged, developed and the exposed copper is etched to form conductor lines. After etching, the photosensitive film is stripped from the copper leaving the circuit pattern on the surface of the innerlayer base material. This processing is also referred to as photolithographic processing in the PCB art and further description is not deemed necessary.

Following individual inner-layer circuit formation, a multilayer stack is formed by preparing a lay-up of innerlayers, ground planes, power planes, etc., typically separated from each other by a dielectric pre-preg typically comprising a layer of glass (typically fiberglass) cloth impregnated with a partially cured material, typically a B-stage epoxy resin. The top and bottom outer layers of the stack usually comprise copper clad, glass-filled, epoxy planar substrates with the copper cladding comprising exterior surfaces of the stack. The stack is laminated to form a monolithic structure using heat and pressure to fully cure the B-stage resin. The stack so formed typically has metal (usually copper) cladding on both of its exterior surfaces. Exterior circuit layers are formed in the copper cladding using procedures similar to the procedures used to form the innerlayer circuits. A photosensitive film is applied to the copper cladding. The coating is exposed to patterned activating radiation and developed. An etchant is then used to remove copper bared by the development of the photosensitive film. Finally, the remaining photosensitive film is removed to provide the exterior circuit layers.

Thru-holes (also often referred to as interconnects) are often used to electrically connect individual circuit layers within the structure to each other and to the outer surfaces, and typically pass through all or a portion of the stack. Thru-holes are generally formed prior to the formation of circuits on the exterior surfaces by drilling holes through the stack at appropriate locations. Following several pre-treatment steps, the walls of the holes are catalyzed by contact with a plating catalyst and metallized, typically by contact with an electroless or electrolytic copper plating solution to form conductive pathways between circuit layers. Following formation of the conductive thru-holes, exterior circuits, or outerlayers are formed using the procedure described above. It is essential that any dielectric used for the substrate must promote such hole formation.

Semiconductor chips and/or other electrical components are next mounted at appropriate locations on the exterior circuit layers of the multilayered stack, typically using solder mount pads to bond the components to the PCB. The components are often in electrical contact with the circuits within the structure through the conductive thru-holes, as desired. The solder pads are typically formed by coating an organic solder mask coating over the exterior circuit layers. The solder mask may be applied by screen coating a liquid solder mask coating material over the surface of the exterior circuit layers using a screen having openings defining areas where solder mount pads are to be formed. Alternatively, a photoimageable solder mask may be coated onto the board and exposed and developed to yield an array of openings defining the pads. The openings are then coated with solder using processes known to the art such as wave soldering.

Development of ever-increasing high speed circuitized substrates for many of today's new products (e.g., computers) has led to the exploration of new materials which would extend the electrical and thermal performance limits of the presently available technology. For high-speed applications, it is necessary to have extremely dense conductor circuitry patterning on low dielectric constant insulating material. Prepreg laminates for conventional circuit boards are traditionally made up of a base reinforcing glass fabric impregnated with a resin, also referred to by some in the industry as "FR4" dielectric material, the FR standing for Flame Retardant and the 4 for the relative value of same. Epoxy/glass laminates, used in some current products, typically contain about 40% by weight fiber glass and 60% by weight epoxy resin, and typically have a relatively high dielectric constant (Er), sometimes higher than 4.0. Such a relatively high Er in turn causes electrical pulses (signals) in adjacent signal circuit lines to propagate less rapidly, resulting in excessive signal delay time. As newer computer systems become faster, system cycle times must become shorter. Delay time contributed by signal travel within the PCB's and other circuitized substrates used in such products will become very significant; hence the need for lower Er laminate materials exists. Many products are expected to require overall Er's of 2.8 or below.

In addition the dissipation factor and signal integrity in such materials is high and a need for low loss alternatives is critical. Such low Er's are impossible to obtain without new materials since the Er's of conventional FR4 epoxy and common fiber glass, as indicated above, are typically in the 4-6 range. The effective Er of such composite materials can usually be approximated by a simple weighted average of the Er of each individual component and its volume fraction contained in the composite. As further explained below, the above compositions are also often heavily weighted with brominated components, to assure the desired FR rating.

Substrates with fluoropolymer dielectric materials are known, including what are referred to as "pure" fluoropolymer substrates. One such example of a known material in use today is polytetrafluoroethylene (PTFE), which has an Er of approximately 2.0. However, using such a material alone in construction of a circuit board laminate has sometimes proven impractical, due to generally poor mechanical properties and chemical inertness of this material as well as high melting point and extremely high melt viscosity. One alternative is to use fluoropolymer as one of the components of a composite laminate material, such as the fiber in the reinforcing cloth. An example of this is the treated PTFE fabric prepreg produced by W. L. Gore and Associates, of Newark, Del. When this type of fabric is used to replace fiberglass in conventional epoxy/glass laminates, the Er drops to 2.8. However use of this fabric presents certain disadvantages. Because of the comparatively low modulus of pure PTFE, thin laminates made with these materials are not very rigid, and require special handling care. Also when laminates incorporating PTFE fabric are drilled, uncut PTFE fibers tend to protrude into the drilled holes and are difficult to remove. In order to obtain good plating adhesion, exposed PTFE surfaces must be treated using either an expensive, highly flammable chemical in a nitrogen atmosphere or by plasma processing, which must penetrate high aspect ratio through holes in order to obtain good plating adhesion. Certainly, one of the biggest disadvantages of PTFE fabric laminate is cost, not only the higher cost due to additional processing requirements and equipment modification, but also the considerable cost of purchasing the prepreg material itself. Further regarding fluoropolymer dielectric materials, in U.S. Pat. No. 5,055,342, entitled "Fluorinated polymeric composition, fabrication thereof and use thereof", and which issued Oct. 8, 1991, there is described a fluorinated polymeric composition exhibiting a low dielectric constant and a low coefficient of thermal expansion containing a fluorinated polymeric material and a silica and/or quartz filler having a mean particle size of no greater than 7 microns. Layers of the above composition are obtained by applying the composition to a substrate and then heating the composition to a temperature sufficient to cause the composition to fuse. The filler material is selected from the group of silica, quartz, hollow micro-spheres and mixtures thereof.

The coefficient of thermal expansion (CTE) of a laminated dielectric material is another important factor with respect to substrate performance. It is desirable to closely match the coefficients of thermal expansion in the X and the Y directions of the dielectric material to that of the adjacent layers in order to prevent cracking of soldered joints linking the PCB to surface mounted devices, or to avoid separation of copper from the dielectric, or to prevent PCB warping. The X and Y direction CTE's are normally controlled by the glass fibers within the matrix. However these fibers do not control Z direction CTE. Z direction CTE must also be controlled in order to prevent cracking of copper plated through holes during heat cycling. Heat is generated in preparing or reworking solder connections, and in other manufacturing processes, and during current flow when the finished board is in operation or subjected to temperature variations during shipment or storage. One way to modify the CTE is by the use of fillers. Fillers may be linked to the matrix polymer to which these are added by the use of a coupling agent, often a silane. The coupling agent improves the bonding between the filler and the polymer, optimizing the interfacial bond area, which also improves both electrical and mechanical performance. Fillers of various types can affect the dielectric loss of a composite. The CTE of a prepreg dielectric material changes markedly when an inflection point called the glass transition temperature (Tg) is reached. Since the expansion rate of the dielectric material increases considerably when the Tg is reached, it is desirable for a dielectric material to have a high Tg in order to minimize stresses. Epoxy novolac based dielectric materials, for example, are considered to have a relatively high Tg, generally 150° C. or greater. Other characteristics associated with high Tg often include low moisture absorption and chemical resistance.

One known material which attempts to meet many of the above requirements is described in U.S. Pat. No. 5,126,192, entitled "Flame Retardant, Low Dielectric Constant Microsphere Filled Laminate", which issued Jun. 30, 1992. According to the teachings of this patent, a resin/silane treated microsphere/carrier structure prepreg is prepared, B-stage cured, and then vacuum laminated. The impregnation mix is prepared by adding a predetermined quantity of microspheres to the resin/solvent mixture sufficient to result in a packing factor of, e.g., about 50% when the solvent is driven off. A low shear mixing technique must be used to avoid damaging the microspheres. Because these are spherical, the microspheres mix in readily and do not increase the viscosity of the solution to a point beyond which impregnation is difficult. The combination of microsphere size and packing factor enables the filled dielectric material to allegedly withstand the heat and pressure cycle of lamination without undergoing breakage of the hollow microspheres. According to this patent, less than 2% microsphere breakage was observed with lamination pressures up to 500 pounds per square inch (PSI). When breakage does occur, the largest microspheres generally collapse first. Hollow silica microspheres containing less than 2% sodium oxide, with 99% by population less than 40 microns in diameter, apparently provided by a company named Grace Syntactics, Inc. under the name "SDT 28", are described as being acceptable. This same company's "SDT-60" microspheres, sized to 99% by population below 25 microns, are described as the preferred filler. The microspheres are treated with the silane-based coupling agent suitable for use with the specific resin. An especially suitable coupler for these formulations is also mentioned. One coupler mix is described as a combination of vinyl silane and amino silane, for best moisture resistance and acceptable wet dielectric loss performance. Silane resin allegedly binds the filler particles within the resin matrix and minimizes the volume of the interfacial areas between the resin matrix and the microspheres. The carrier/reinforcement material in this patent may be any known shell type reinforcement such as glass or polytetrafluoroethylene (PTFE). The carrier fabric selected depends mostly on the properties desired for the finished laminate. These include thickness, Er, CTE, and the intended product application. Carrier materials include woven and non-woven fiberglass and polymer fabrics and mats. Organic films such as polyimide film can also be used. Low Er fabrics such as D-glass, aramids such as Kevlar and Nomex, both registered trademarks of E. I. Dupont de Nemours and Company, poly p-phenylene benzobisthiazole, poly p-phenylene benzobisoxazole, Polyetheretherketone, aromatic polyesters, quartz, S-glass, and the like, can also be used in the formulation. The reinforcement can be in a cowoven or comingled form.

Another known material designed for use in circuitized substrates such as defined above and which is intended to also meet the above requirements of today's high-speed products is described in U.S. Pat. No. 6,207,595, entitled "Laminate And Method Of Manufacture Thereof", which issued Mar. 27, 2001. In this patent, the dielectric layer's fabric material is made from a cloth member having a low enough content of particulates and a sufficient quantity of resin material to completely encase the cloth member including the particulates, so that the resin material extends beyond the highest protrusions of the cloth member (i.e. the fabric material is thicker and will pass a certain test standard (in '595, the known HAST level A test). Thus, the woven cloth is known to include a quantity of particulates, which term is meant in '595 to include dried film, excess coupler, broken filaments, and gross surface debris. A process is described where a sizing of polyvinyl alcohol, corn starch and a lubricant of oil is applied to the strands of fiber prior to weaving in order to improve the weaving process and minimize breakage of the strands. After weaving, the sizing is removed by a firing step to clean the filaments of lubricants and other materials. However, some sizing is randomly left behind as particulates. Encasing the woven cloth including the particulates is a quantity of hardened resin material. The resin may be an epoxy resin such as one often used for "FR4" composites. A resin material based on bismaleimide-triazine (BT) is also acceptable for the structure in this patent. More preferably, the resin is a phenolically hardenable resin material known in the PCB industry. This patent thus requires continuous fibers (those extending across the entire width (or length) of the dielectric layer except for possible inadvertent interruptions caused by drilling of the thru-holes needed in the final product, causing these fibers to become what might be called as "broken". The aforementioned problem with fiber strands exposed to the holes is thus possible in this patent's process and resulting structure.

In U.S. Pat. No. 5,418,689, there is described a PCB product wherein the dielectric substrate can include a thermoplastic and/or thermosetting resin. Thermosetting polymeric materials mentioned in this patent include epoxy, phenolic base materials, polyimides and polyamides. Examples of some phenolic type materials include copolymers of phenol, resorcinol, and cresol. Examples of some suitable thermoplastic polymeric materials include polyolefins such as polypropylene, polysulfones, polycarbonates, nitrile rubbers, ABS polymers, and fluorocarbon polymers such as polytetrafluoroethylene, polymers of chlorotrifluoroethylene, fluorinated ethylenepropylene polymers, polyvinylidene fluoride and polyhexafluoropropylene. The dielectric materials may be molded articles of the polymers containing fillers and/or reinforcing agents such as glass filled polymers. "FR4" epoxy compositions that are employed in this patent contain 70-90 parts of brominated polyglycidyl ether of bisphenol-A and 10-30 parts of tetrakis (hydroxyphenyl) ethane tetraglycidyl ether cured with 3-4 parts of dicyandiamide, and 0.2-0.4 parts of a tertiary amine, all parts being parts by weight per hundred parts of resin solids. Another "FR4" epoxy composition may contain about 25 to about 30 parts by weight of a brominated digylcidyl ether of bisphenol-A having an epoxy equivalent weight of about 350 to about 450; about 10 to about 15% by weight of a brominated diglycidyl ether of bisphenol-A having an epoxy equivalent weight of approximately 600 to about 750 and about 55 to about 65 parts per weight of at least one epoxidized nonlinear novolak having at least 6 terminal epoxy groups; along with suitable curing and/or hardening agents. A still further "FR4" epoxy composition contains 70 to 90 parts of brominated polyglycidyl ether of bisphenol-A and 10 to 30 parts of tetrakis (hydroxyphenyl) ethane tetraglycidyl ether cured with 0.8-1 phr of 2-methylimidazole. Still other "FR4" epoxy compositions employ tetrabromobisphenol-A as the curing agent along with 2-methylimidazole as the catalyst.

In U.S. Pat. No. 6,323,436, PCBs are prepared by first impregnating a non-woven aramid chopped fiber mat or a thermoplastic liquid crystalline polymer (LCP) paper instead of the reinforcement typically used in the electronics industry, described in this patent as a woven glass fabric. The aramid reinforcement is comprised of a random (in-plane) oriented mat of p-aramid (poly(p-phenylene terephthalamide) fibers comprised of Kevlar (Kevlar is a registered trademark of E. I. DuPont de Nemours and Company), and has a dielectric constant of 4.0 as compared to 6.1 for standard E-glass cloth. The lower permittivity of the non-woven aramid reinforcement provides for faster signal propagation, allowing increased wiring density and less crosstalk, which becomes increasingly important for high I/O chips and miniaturization. Since the p-aramid fibers are transversely isotropic and have an axial CTE of about -3 to about -6 ppm/° C. when combined with a thermosetting resin, the final composite described in this patent is said to possess a CTE which can be controlled and adjusted to match that of silicon or semiconductor chips in the range of about 3 to about 10 ppm/° C. The thermoplastic liquid crystal polymer paper is a material called Vecrus (Vecrus is a registered trademark of Hoechst Celanese Corp.). LCP paper uses the company's Vectra polymer (Vectra also being a registered trademark of Hoechst Celanese Corp.). According to this patent, it has a dielectric constant of 3.25 and a dissipation factor of 0.024 at 60 Hz. The polymer paper has a UL94-V0 rating and an in-plane CTE of less than 10 ppm/° C. The alleged advantages of this material over the aramid mat are the lower dielectric constant and very low moisture absorption, less than 0.02%. The non-woven aramid or LCP paper is used in conjunction with a thermosetting resin to form the final composite substrate. Examples of thermosetting resins described as being useful in this patent include epoxy, cyanate ester, bismaleimide, bismaleimide-triazine, maleimide or combinations thereof. The resin-impregnated low CTE reinforcement is then partially cured to a "B"-stage to form the prepreg, and then the prepreg is cut, stacked, and laminated to form a subcomposite with exterior copper sheets.

Yet another type of dielectric materials known for use in circuitized substrates include those known as "expanded PTFE" materials, PTFE of course being the designate for polytetrafluoroethylene. A more common example of such material is the aforementioned Teflon, sold by E. I. DuPont de Nemours and Company. In U.S. Pat. No. 5,652,055, for example, there is described an adhesive sheet (or "bond film") material suitable to serve as adhesive layers in a variety of adhesive applications, such as in circuit board laminates, multi-chip modules, and in other electrical applications. The adhesive sheet is described as being constructed from an expanded polytetrafluoroethylene (PTFE) material, such as that taught in U.S. Pat. No. 3,953,566. Preferably, the material is filled with an inorganic filler material and is constructed as follows. A ceramic filler is incorporated into an aqueous dispersion of dispersion-produced PTFE. The filler in small particle form is ordinarily less than 40 microns in size, and preferably less than 15 microns. The filler is introduced prior to co-coagulation in an amount that will provide 10 to 60%, and preferably 40 to 50% by weight filler in the PTFE, in relation to the final resin-impregnated composite. The filled PTFE dispersion is then co-coagulated, usually by rapid stirring. The coagulated filled PTFE is then added. The filled material is then lubricated with a common paste extrusion lubricant, such as mineral spirits or glycols, and then paste extruded. The extrudate is usually calendared, and then rapidly stretched to 1.2 times to 5000 times, preferably 2 times to 100 times, per this patent, at a stretch rate of over 10% per second at a temperature of between 35° C. and 327° C. The lubricant can be removed from the extrudate prior to stretching, if desired. The resulting expanded, porous filled PTFE is then imbibed with adhesive by dipping, calendaring, or doctor blading on a varnish solution of about 2% to 70% adhesive in solvent. The wet composite is then affixed to a tenter frame, and subsequently B-staged at or about 165° C. for 1 to 3 minutes. The resulting sheet adhesive thus obtained typically consists of: (a) 9 to 65 weight percent PTFE; (b) 9 to 60 weight percent inorganic filler, in the form of particulate; and (c) 5 to 60 weight percent adhesive imbibed within the porous structure of the filled PTFE web. Other types of expanded-PTFE substrate materials are described in U.S. Pat. Nos. 4,187,390 and 4,482,516, as well as others. U.S. Pat. No. 4,187,390 is particularly interesting because it delves substantially into both nodes and fibrils used as part of such substrate materials, breaking these down into such dimensional constraints as node height, node width, node length, and fibril length.

U.S. Pat. No. 4,634,631 describes a flexible circuit laminate including a microglass reinforced fluoropolymer layer sandwiched between a polyimide substrate and a copper conductive pattern. The glass reinforced fluoropolymer acts as a high bond strength adhesive between the polyimide and copper conductive pattern and, according to the authors, also contributes to improved dimensional stability as well as improved electrical performance. The described microglass content is between about 4 to about 30 weight percent, and more preferably about 20 weight percent glass. In the method described in this patent for making the flexible circuit laminate, the polyimide substrate undergoes a preferably alkaline microetching surface treatment, followed by rinsing, drying and lamination to the microglass reinforced fluoropolymer and copper layers.

In U.S. Pat. No. 4,849,284, there is described a ceramic filled fluoropolymer-based electrical substrate material for forming rigid printed wiring board substrate materials and integrated circuit chip carriers. According to the authors, the material exhibits improved electrical performance over other printed wiring board materials and circuit chip carriers, and the low coefficients of thermal expansion and compliant nature of these substrate materials result in improved surface mount reliability and plated through-hole reliability. The electrical substrate material comprises polytetrafluoroethylene filled with silica along with a small amount of microfiberglass. The ceramic filler (silica) is coated with a silane coating material which renders the surface of the ceramic hydrophobic and provides improved tensile strength, peel strength and dimensional stability.

In some known dielectric compositions, as mentioned above (e.g., the "FR4" dielectric material), bromine is used as one of the composition elements. Bromine is considered beneficial to provide moisture and flammability resistance and to assist in assuring a high glass transition temperature for the resulting structure. In one known composition, this material is believed to constitute approximately thirty percent (%) of the composition, by weight, in addition to bisphenol-A, a known industrial chemical used in epoxy resins (and other products), and epoxy cresol novolac resin.

The present invention represents a significant improvement over dielectric compositions such as those above which are then formed into dielectric layers for use in the production of circuitized substrates such as PCBs. One particularly significant feature of this invention is the provision of a dielectric material which includes two fluoropolymers, a low melting point fluoropolymer and a higher melting point fluoropolymer, in combination with two fillers, one with low thermal conductivity and the other a higher thermal conductivity. The resulting composition, when utilized as a dielectric material within a substrate, exhibits a low dielectric constant, a low coefficient of thermal expansion, and good thermal conductivity. Additional advantageous features of this composition will be defined in greater detail below. It is believed that such an invention will represent a significant advancement in the art.

OBJECTS AND SUMMARY OF THE INVENTION

It is a primary object of the invention to enhance the art of circuitized substrates.

It is another object to provide an improved dielectric composition which can be utilized to form a dielectric layer within a circuitized substrate and which can be produced successfully using conventional manufacturing procedures.

It is still another object of this invention to provide such a composition that will possess many desirable attributes necessary for successful incorporation with substrates used for high-speed signal propagation, as well as in relatively harsh environments (e.g., those of high moisture).

According to one embodiment of the invention, there is provided a dielectric composition adapted for use in circuitized substrates, this dielectric composition comprising first and second fluoropolymers, the first fluoropolymer having a first melting point and the second fluoropolymer having a second melting point lower than the first melting point; and first and second inorganic fillers, the first filler having a first thermal conductivity and the second filler having a thermal conductivity lower than the first thermal conductivity.

According to another embodiment of the invention, there is provided a circuitized substrate comprising at least one electrically conductive layer and at least one dielectric layer including a dielectric composition including first and second fluoropolymers, the first fluoropolymer having a first melting point and the second fluoropolymer having a second melting point lower than the first melting point, and first and second inorganic fillers, the first filler having a first thermal conductivity and the second filler having a thermal conductivity lower than the first thermal conductivity.

BEST MODE FOR CARRYING OUT THE INVENTION

For a better understanding of the present invention, together with other and further objects, advantages and capabilities thereof, reference is made to the following disclosure and appended claims.

By the term "circuitized substrate" as used herein is meant a substrate product including one or more dielectric layers and one or more electrically conductive layers. Such products as known in the art included printed circuit boards (a/k/a printed wiring boards) and cards, and chip carriers (substrates adapted for having one or more electronic components such as a semiconductor chip mounted thereon).

The circuitized substrates produced of the dielectric compositions taught herein are adapted for use in many electronic products, perhaps the best known of these being what may be referred to as "information handling systems." As used herein, this term shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as computer servers and mainframes. Such products are well known in the art and are also inorganic known to include PCBs and other forms of circuitized substrates as part thereof, some including several such components depending on the operational requirements thereof.

As defined herein, the compositions of this invention provide a dielectric layer within a circuitized substrate that exhibits reduced dielectric constant, reduced dielectric loss factor, reduced cure shrinkage, reduced coefficient of thermal expansion (CTE) and good thermal conductivity.

The present invention comprises a dielectric composition adapted for use in the above circuitized substrates, the dielectric composition comprised of a binary fluorinated polymeric matrix and at least two inorganic filler materials (hereinafter, fillers). The matrix comprises two fluoropolymers, each with different melting points such that one may be referred to as a "high melting point" and the other a "low melting point." By the term "high melting point" as used herein is meant a melting point within the range of from about 300° Celsius (C.) to about 350° C., while the term "low melting point" as used herein is meant a melting point within the range of from about 200° C. to about 280° C. Examples are provided below.

Of further significance, the inorganic fillers are each of a different thermal conductivity, one referred to as having a "high thermal conductivity" and the other as having a "low thermal conductivity." By the term "high thermal conductivity" as used herein is meant a thermal conductivity within the range of from about 600 W/m.K° to about 2000 W/m.K°, while the term "low thermal conductivity" as used herein is meant a thermal conductivity within the range of from about 5 W/m.K° to about 400 W/m.K°. The combination of such materials with such properties assures a resulting dielectric layer which exhibits a low dielectric constant (e.g., from about 2.8 to about 3.6), and a low coefficient of thermal expansion (e.g., from about fourteen ppm/° C. to about 79 ppm/° C.) and heat dissipation. As understood from the following Examples, such compositions are relatively easy to process and utilize as dielectric materials for circuitized substrates. Significantly, the ratio of high and low melting point fluoropolymers can be adjusted to achieve relatively significant changes in melting points for the final product, creating the opportunity for hierarchal melting point constructions while significantly improving manufacturing yields. In addition, the resulting compositions may be sintered at relatively lower temperatures than known for many currently used fluoropolymer compositions. The fillers themselves are comprised of particles having a relatively small size, less than about 10 microns and preferably in the 3-5 microns range having good mono-dispersity for aiding laser drilling when very dense circuitry is required. Still further, the resulting compositions provide layers which can be easily drilled (mechanically and by laser) and/or punched to provide the requisite number of conductive thru-holes therein, an especially desirable feature if the resulting substrates are to be combined to form larger (thicker) multi-layered structures having several dielectric and conductive layers. Use of lasers to "drill" such thru-holes is especially desirable, considering that such hole formation can be achieved at relatively high densities and in large numbers. All of these features, and others discernible from the teachings herein, are highly desirable in the circuitized substrate field.

The compositions taught herein may be formed into layers either alone (without support structure) or in combination with such support structure, the most well known example of such structure being fiber-glass fabric conventionally used with various resins in the PCB industry. In the case of the latter, the composition is coated onto the fabric support and a layer of both formed as a single entity. Layers formed using the compositions alone or in combination with supporting structure may have a thickness within the range of from about 0.5 mils (a mil being a thousandth of an inch) to about five mils.

The composition of the invention includes at least the aforementioned two inorganic fillers, each of a material including silica, alumina, aluminum oxide, aluminum nitride, silicon nitride, silicon carbide, boron nitride, diamond powder, titanium oxide, ceramic and combinations thereof, each of course selected so as to possess the defined thermal conductivity relative to the other. In one example, these fillers are comprised of spherical crystalline or amorphous silica and comprise from about 10 to about 60% by weight of the final composition. One preferred example of such silica is sold by Tatsumori, Ltd., having a business location #2-9-3 Shibakoen Minato-ku, Tokyo, Japan (represented by Tatsumori U.S.A., Inc., New York, N.Y.), under the product names "PLV-6", having a mean particle size of about 5.2 microns. Another is Tatsumori's "PLV-4" silica, having a mean particle size of 3.4 microns. Yet another is Tatsumori's "PLV-3" silica with a mean particle size of about 2.8 microns.

Another source for silica fillers is Asahi Glass SI-Tech. Co., Ltd., 13-1, Kitaminato-machi, Wakamatsu-ku, Kitakyushu, Fukuoka, 808-0027, Japan. Two types of products are of use, the low oil absorption grade having a mean particle diameter of 3-20 μm and the non-porous grade (NP series) with a mean particle diameter 4-20 μm (NP-100, NP-30). Additional sources of spherical silica are Shiima Electronics Inc located at 2-82 Hanasaki-cho Naka-ku Yokohama-shi Kanagawa-ken, Japan 231-0063 and KOSEM, Korea Semiconductor Material located at 116 Yangji-Ri, Yeonmu-Eup, Nonsan City, Chungnam, Korea.

Understandably, each filler can be a combination of two or more of these silicas forming a binary or ternary composition. The Tatsumori silicas have spherical particle configurations. Additional filler materials usable in the invention include those sold by Admatech AB, having a business location at Datavägen 20, SE-436 32 ASKIM, Sweden under their "AE" (alumina) and "SE" (silica) series of products. Examples include Admatech's "SE2300" (mean particle size of only 0.4-0.6 microns), "SE5300" (mean particle size of 1.3-2.0 microns), "SE6300" (mean particle size of 1.5-2.5 microns), "SE4050" (mean particle size of 1.5-2.5 microns), "AE2100" (mean particle size of 0.7-1.0 microns) and "{AE9100" (mean particle size of 5.0-7.0 microns). In one embodiment of the invention, it is desired to include both fillers at a ratio of from about 9:1 to about 1:9 of the higher thermally conductive filler to the lower thermally conductive filler. Examples include: Aerosil 200 (a fumed silica obtainable from Degussa AG, having an address at Bennigsenplatz 1, D-40474, Dusseldorf, Germany), having an average particle size of 12 nanometers or a surface area of about 175 to about 225 square meters per gram and an silicon dioxide (silica) content greater than 99.8%); SDT-60 hollow microspheres (obtainable from Grace Syntactic) and having an average particle size of 7 um; and Quso G135 (also available from Degussa), a precipitated silica, having about 98% silicon dioxide and a surface area of about 180 square meters per gram and an average agglomerate size of 2 microns. Certain ones of such fillers (e.g., the Quso G135 filler), also act as anti-settling agents.

The above fillers, if silicas, are preferably spherical amorphous silicas, and, as stated above, when in the percentages described, provide a determining factor in the coefficient of thermal expansion (CTE) for the resulting dielectric layer. The spherical nature of this filler allows high volumetric loading of the filler without driving the melt viscosity of the composition too high to preclude ordinary lamination processing. In one specific example, about fifty percent by weight of this particular silica may be used. The silica may be in the form of spherical or semi-spherical amorphous particles or in the form of hollow silica microspheres, or combinations thereof. The silica filler material is an important element in the composition because it allows for the elimination of, and, if used, reduction in cloth (supporting material) content while still achieving low (and more isotropic in nature) CTE values for the composition. The inclusion of such fillers can result in an isotropic CTE providing additional reliability to the thru-holes (especially those which are plated with conventional metallurgy such as copper or copper alloy) which is yet another attribute of the present invention. The inclusion of two different silicas also improves electrical properties for dielectric layers which include the supporting fiber-glass cloth as part thereof, because displacement of some of the cloth provides the composition with a lower dielectric constant (Er), the cloth having a higher Er value. Adding a particulate filler such as one or more silicas as taught herein would normally increase the brittleness of the dielectric layer, which is undesirable. The combination of the two fluoropolymers, however, assures that such brittleness in the final layer is at a reduced, acceptable level. The above examples of fillers are representative only and not meant to limit this invention. The micron size of each of the particles of both inorganic fillers, as stated, is preferably 10 microns or less, the examples above all exhibiting sizes lower than 10 microns.

The fluoropolymers employed pursuant to the present invention are well-known and include such commercially available polyfluoroalkylene materials as polytetrafluoroethylene, copolymers of tetrafluoroethylene and hexafluoropropylene, copolymers of tetrafluoroethylene and perfluoro-2-2-dimethyl-1,3 dioxide, polytrifluorochloroethylene, copolymers of tetrafluoroethylene with, for example, olefins such as ethylene; copolymers of trifluoromonochloroethylene with, for example, olefins such as ethylene, and polymers of perfluoroalkyl vinyl ether. Some commercially available fluoropolymers employed pursuant to the present invention include those available under the trade designation TEFLON PTFE (polymers of tetrafluoroethylene), TEFLON FEP (perfluorinated ethylene-propylene copolymers); TEFLON PFA (copolymer of tetrafluoroethylene and perfluoroalkoxy); TEFZEL (copolymer of tetrafluoroethylene and ethylene); HALAR (copolymer of chlorotrifluoroethylene and ethylene); KEL-F (polymer of chlorotrifluoroethylene); HBF-430 (polymer of chlorotrifluoroethylene) and TEFLON AF (copolymer of tetrafluoroethylene and at least 65 mole % of perfluoro-2,2-dimethyl-1,3 dioxide). Teflon is a trademark of E.I. DuPont deNemours & Company (DuPont) and Halar is a trademark of Solvay Solexis S.p.A.

As stated, the compositions of the present invention include at least two fluoropolymers as part thereof, each with a different melting point. More specific examples of fluoropolymers as defined above for use in the invention include those sold by du Pont under the product names "Teflon PTFE 30", "Teflon PTFE 304A", "Teflon PTFE 305A", "Teflon PTFE 30B", "Teflon PTFE TE-3823" and "Teflon PTFE K-20", each of these having a melting point of about 327 degrees C. PTFE is understood to mean polytetrafluoroethylene. duPont has a business location at 1007 Market Street, Wilmington, Del. "Teflon PTFE 30" is a negatively charged, hydrophobic colloid containing polytetrafluoroethylene resin particles (0.05-0.5 microns) suspended in water. It also includes a nonionic wetting agent and stabilizer, and has a viscosity at room temperature of approximately 20 cP, and a nominal pH of 10. It is known to possess outstanding dielectric properties which are considered very stable when exposed to frequency and temperature changes. Another du Pont fluoropolymer suitable for use in the invention is "Zonyl PTFE TE-3667N", having a melting point of about 325° C. Zonyl is also a trademark of du Pont. This fluoroadditive is also a negatively charged, hydrophobic colloid with similar size resin particles as the "Teflon PTFE 30" material, and also possesses similar viscosity and pH values. It has a low molecular weight. Still further du Pont fluoropolymers usable herein include "Teflon PFA 335", with a melting point of about 305° C., and "Teflon FEP 121A", having a melting point of 260° C. Another fluoropolymer which can be used herein is sold under the product name "Halar ECTFE" by the above mentioned Solvay Solexis S.p.A, having a business location at Viale Lombardia 20, 1-20021 Bollate (MI), Italy. This product is a copolymer of ethylene and chlorotrifluoroethylene, and has a melting point of about 240° C. It is a partially fluorinated semi-crystalline polymer with high purity. As yet another example of a suitable fluoropolymer, a product sold under the name "Fluon LM-ETFE", is acceptable. This fluoropolymer is a melt-processable copolymer of ethylene and tetrafluoroethylene, and possesses a melting point of about 225-260° C. Fluon is a trademark of Asahi Glass Company (ACG), having a business location at 81-12-1, Yurakucho, Chiyoda-ku, Tokyo 100-8405 JAPAN. In one embodiment of the invention, the ratio of the higher ("high") melting point melting point fluoropolymer is within the range of from about 9:1 to about 1:9. Both fluoropolymers together comprise from about 50 to about 90 percent by weight of the composition.

In addition, if desired, the fillers can be coated with a silane in amounts of about 0.2 to about 2.0% (typically about 1%) by weight of the filler in order to render such more hydrophyllic. Typical silanes include p-chloromethylphenyltrimethoxy silane, aminoethylaminotrimethoxy silane, aminoethylaminopropyltrimethoxy silane.

The compositions of the invention also preferably include a coupling agent, a preferred such agent being silane, comprising only about 0.50 percent by weight of the composition. A preferred silane is a fluorosilane by the name tridecafluoro-1,1,2,2-tetrahydrooctyl-1-triethoxysilane marketed by United Chemical Technologies, Inc., having a business location at 2731 Bartram Road, Bristol, Pa. 19007-6893. Additional silanes that can be used in the present invention are phenyl trimethoxy silane and tridecafluoro-1,1,2,2-tetrahydrooctyl-1-trichlorosilane. The coupling agent as used herein functions to assist in chemical bonding of the silica filler and the resin as well as to improve the adhesion between the resulting dielectric material and the conductive layers (e.g., copper) used in circuitized substrates and also provide good alkaline resistance to the composite layer. The silane is used to directly treat the silica particles before incorporation within the composition.

It is important to the success of the present invention that the amount of the binary fluropolymer system employed is equal to or greater than the amount of the composite filler system and preferably the compositions contain about 50 to about 90% by weight and most preferably about 50 to about 70% by weight of the fluoropolymers and correspondingly about 10 to about 50% by weight and preferably about 30 to about 50% by weight of the fillers. These amounts are based upon the total of the filler and fluorinated polymeric material in the composition in the dry state.

It is recommended that the compositions of the present invention include surface active agents such as non-ionic surfactants and anti-settling agents. Such are normally employed in amounts of about 0.1 to about 10% by weight of the total composition and preferably about 0.5 to about 6% by weight. In fact, commercially available fluorinated polymer preparations include a surfactant. It is also recommended that the pH of the composition should be about 8 to about 11, and most preferably about 9 to about 10 in order to facilitate the processing. The pH can be controlled by adding a suitable base such as ammonium hydroxide.

The compositions of the present invention can be prepared by admixing aqueous dispersions of the fluorinated polymeric materials with a prepared filler dispersion under high speed agitation such as a high speed disperser at about 3000 to about 5000 RPM for about 10 to about 15 minutes. When filler dispersion is prepared just prior to use relatively low speed agitation of about 100 RPM can be employed. The filler dispersion in turn should then be obtained under high speed agitation such as high speed dispersion at about 3000 to about 5000 RPM for about 10 to about 15 minutes. The high speed disperser disperses the silica and/or quartz filler and deagglomerates the particles.

The composition is then coated onto a suitable substrate. This can be done as single sheets on a substrate or a continuous coating on a web type substrate. The coating is applied to the desired thickness of about 0.2 mils or higher and normally about 0.5 to about 5 mils, and preferably about 0.5 to about 3 mils thick.

After coating the desired composition onto a substrate to the desired thickness, the coating is baked to remove the surfactant when present at a temperature of about 240° C. to about 320° C. and preferably about 300° C. to about 320° C. Then the layer is fused at a temperature of about 260° C. to about 400° C. and preferably at about 260° C. to about 380° C. Prior to the removal of surfactant, if desired, the water from the composition can be removed by heating at about 110° C. for about 20 to about 60 minutes. The heating to remove surfactant is from about 0.30 hour to about 2 hours and preferably about 1.5 hours. The heating to cause the fusion or densification of the composition is usually for about 30 to about 120 minutes and generally carried out under pressure such as about 1000 to about 3000 PSI and preferably about 1200 to about 1800 PSI.

At this point, the substrate onto which the coating is deposited if desired can be removed such as by etching to provide a free-standing film of the fluorinated polymeric material and filler. Typical substrates employed in the process include copper and copper/Invar/copper (CIC) composites. Such substrates are usually about 0.7 to about 40 mils thick and preferably about 0.7 to about 3 mils thick. When copper or copper composites are employed, such can be removed from the fluorinated polymeric composite by etching in a typical copper etchant such as cupric chloride.

Suitable surface active agents that can be employed include non-ionic surface active agents. A preferred surface active agent is octylphenoxyethanol, which is commercially available under the trade designation Triton X-100 from Rohm and Haas, having a business address at 100 Independence Mall West, Philadelphia, Pa.

The compositions prepared pursuant to the present invention can be subjected to drilling or punching including laser drilling to provide desired vias in the substrate. The laser drilling is carried out with the coating facing the laser and employing various lasers with wavelengths from UV to IR region with 308 nanometers being preferred and a fluence between about 3 to about 30 joules/cm$^2$ (at 308 nm), typically about 10 joules/cm employing a noble gas-halide laser such as xenon chloride. The laser drilling can either be the contact or projection type. In order to provide vias in predetermined areas, a laser resistant coating such as copper or copper/Invar/copper can be provided on the substrate over those areas where holes are not to be provided.

If a cloth is used as the substrate, however, the amount of composition applied to the cloth is dependent on the desired final thickness of the pressed (e.g., laminated) dielectric layer. Significantly, inclusion of the silica filler material as taught herein allows for the use of thinner and lighter styles of glass cloths while still achieving the desired thicknesses and also while maintaining or improving the dimensional changes both in the x-y and vertical planes of a circuitized substrate. The resulting combination of silica filler and thinner, lighter cloths also improves laser drilling of the dielectric layer (to provide the aforementioned thru-holes) by increasing the organic/inorganic homogeneity of the material. The insulation resistance reliability of the laminated material is also improved due to the reduction of the glass fiber contact with conductive material(s). Of further significance, the presence of the silica filler material improves the adhesion of the copper plating and acts to improve crack resistance and improved plated through hole reliability, in addition to the other advantages cited hereinabove.

The glass cloth may be impregnated with the composition materials, dried, sintered, and then laminated with other layers desired for use as part of the finished circuitized substrate, these including the conductive layer(s) and other dielectric layers. The result is a circuitized substrate having the several highly advantageous features defined herein. One example of the key electrical, thermal, physical and thermal expansion properties attainable using the composition of the appended Examples is shown in the following Table. Generally speaking, the dielectric layers produced using the teachings of the invention may possess a dielectric constant within the range of from about 2.45 to about 3.6, a loss factor at 1 MHz within the range of from about 0.0008 to about 0.003 and a decomposition temperature within the range of from about 400° C. to about 500° C.

EXAMPLE ONE

A composition containing about 112 grams of a polytetrafluoroethylene (PTFE) aqueous dispersion TEFLON PTFE TE-382 (60% (by total weight) of 0.05 to 0.5 microns PTFE resin particles and formulated with a nonionic wetting agent which burns off at approximately 50° C. lower than traditional surfactants) and about 224 grams of Teflon PFA 335 (60% (by total weight) of 0.05 to 0.5 microns perfluoroalkoxy (PFA) resin particles suspended in water), was mixed with 220 grams of PLV-6 silica (available from Tatsumori) having an average particle size of 5.2 microns under high agitation in a high speed disperser at about 2000 to about 5000 RPM for about 15 to 25 minutes and allowed to equilibrate for 1 to about 2 hours. The composition was then coated, using techniques well known in the coatings industry, from the aqueous dispersion onto a copper substrate to a thickness of about 2.6 mils thick. The coating was then heated at a temperature of about 100° C. to about 115° C. to remove water followed by heating 1 hour at 240° C. to 260° C. to remove the surfactant, sintered to peel it off a belt or in this case a stand alone sheet and was then pressed under a pressure of about 1600 PSI to about 2000 PSI for about 65 minutes at about 300° C. to about 350° C. The obtained thickness of the film is about 1.8 to 2.0 mils thick. The substrate copper in this case is removed by etching in cupric chloride to obtain a free standing film of good quality. The dry composite after fusing has a coefficient of thermal expansion (CTE) in the range of about 14 ppm/° C. to about 28 ppm/° C., a dielectric constant of about 2.68 and composite density of about 2.16 g/cc.

EXAMPLE TWO

A suspension containing about 134.4 grams of a polytetrafluoroethylene (PTFE) aqueous dispersion TEFLON PTFE 30B (60% (by total weight) having particle size as above in Example 1), about 201.6 grams of Teflon PFA 335 (60% (by total weight) of 0.05 to 0.5 microns perfluoroalkoxy (PFA) resin particles suspended in water) was mixed with 187 grams of Tatsumori PLV-3 silica having an average particle size of 2.8 microns under high agitation in a high speed disperser at about 2000 to about 5000 RPM for about 15 to 25 minutes and allowed to equilibrate for 30 minutes to about 2 hours. The composition was then coated from the aqueous dispersion onto a copper substrate to a thickness of about 2.5 mils thick. The coating was then heated to remove water at a temperature of about 100° C. to about 115° C. followed by heating 1 hour at 240° C. to 260° C. to volatilize the surfactant, sintered, and then pressed under a pressure of about 1600 PSI to about 2000 PSI for about 65 minutes at about 310° C. to about 350° C. The obtained thickness of the film is about 1.6 to 1.9 mils thick. The copper is removed by etching in cupric chloride and dried to obtain a film having composite coefficient of thermal expansion (CTE) in the range of about 16.2 ppm/° C. to about 28 ppm/° C., a dielectric constant of 2.48 and a composite density of 2.15 g/cc.

EXAMPLE THREE

A binary fluoropolymer suspension containing about 63.8 grams of a polytetrafluoroethylene (PTFE) aqueous dispersion TEFLON PTFE TE-3823 (60% (by total weight) of 0.05 to 0.5 microns PTFE resin particles and formulated with a nonionic wetting agent which burns off at approximately 50° C. lower than traditional surfactants), about 225 grams of Teflon FEP 121 A (54% (by total weight) of 0.1 to 0.3 microns fluorinated ethylene propylene (FEP) resin particles suspended in water) was mixed with 154 grams of Tatsumori PLV-4 silica having an average particle size of 3.8 microns were dispersed into a homogeneous mixture. The suspension was then coated onto a copper substrate to a thickness of about 2.2 mils thick. The coating was then heated to remove water at a temperature of about 100° C. to about 115° C. followed by heating 1 hour at 240° C. to 260° C. to volatilize the surfactant, sintered, and then pressed under a pressure of about 1600 PSI to about 2000 PSI for about 65 minutes at about 265° C. to about 350° C. The obtained thickness of the film is about 1.3 to 1.6 mils thick. The copper is removed by etching in cupric chloride to obtain a free standing film. The dry composite after fusing has a composite expansion in the range of 22.5 ppm/° C. to 30ppm/° C., a dielectric constant of 2.45 and a composite density of 2.15 g/cc.

EXAMPLE FOUR

A ternary fluoropolymer composition containing about 29 grams of a polytetrafluoroethylene (PTFE) aqueous dispersion TEFLON PTFE TE-3823 (60% (by total weight) of 0.05 to 0.5 microns PTFE resin particles and formulated with a nonionic wetting agent which burns off at approximately 50° C. lower than traditional surfactants), about 34.8 grams of Teflon PFA 335 (60% (by total weight) of 0.05 to 0.5 microns perfluoroalkoxy (PFA) resin particles suspended in water), and about 227 grams of Teflon FEP 121 A (54% (by total weight) of 0.1 to 0.3 microns fluorinated ethylene propylene (FEP) resin particles suspended in water) was mixed with 164 grams of spherical alumina having an average particle size of 2-8 microns available from Admatechs Vo. Ltd. under the trade designation AO-900H in a high speed disperser at about 2000 to about 5000 RPM for about 15 to 25 minutes and allowed to equilibrate for about 2 hours. The suspension was then coated onto a copper substrate to a wet thickness of about 2.2 mils thick. The coating was then heated to remove water at a temperature of about 100° C. to about 115° C., followed by heating I hour at 240° C. to 260° C. to volatilize the surfactant, sintered, and pressed under a pressure of about 1600 PSI to about 2000 PSI for about 65 minutes at about 265° C. to about 350° C. The copper is removed by etching to obtain a free standing having a thickness of about 1.3 to 1.6 mils. The dry composite after fusing has a coefficient of thermal expansion (CTE) in the range of about 42 ppm/° C. to about 53 ppm/° C., a dielectric constant of 2.97 and a composite density of 2.54 g/cc.

(Significantly, Example Four includes the addition of a third fluoropolymer to the composition, meaning that the invention is not limited to using only two fluoropolymers. Of further significance, each of these fluoropolymers has a different melting point than that of the other two. By way of example, the fluoropolymers in Example Four possessed melting points of about 327° C. to about 335° C. (the PTFE), about 305° C. (the PFA) and about 260° C. (the FEP). Additional examples of such three-fluoropolymer compositions are provided herein-below in Examples Five and Seven.)

EXAMPLE FIVE

A ternary composition containing about 48 grams of a polytetrafluoroethylene (PTFE) aqueous dispersion TEFLON PTFE TE-3823 (60% (by total weight) of 0.05 to 0.5 microns PTFE resin particles and formulated with a nonionic wetting agent which burns off at approximately 50° C. lower than traditional surfactants), about 52 grams of Teflon PFA 335 (60% (by total weight) of 0.05 to 0.5 microns perfluoroalkoxy (PFA) resin particles suspended in water), and about 196 grams of Teflon FEP 121 A (54% (by total weight) of 0.1 to 0.3 microns fluorinated ethylene propylene (FEP) resin particles suspended in water) was mixed according to the conditions in Example Four with 147 grams of spherical silica having an average particle size of 4 microns available from Fuso Chemical Ltd. under the trade designation SP-4B. The composition was processed with similar conditions as in Example 4 giving a dry film having thickness of about 1.3 to 1.6 mils. The dry film has a coefficient of thermal expansion (CTE) in the range of about 26 ppm/° C. to about 33 ppm/° C., a dielectric constant of 2.44 and a composite density of 2.14 g/cc.

EXAMPLE SIX

A binary fuoropolymer composition containing about 56 grams of a polytetrafluoroethylene (PTFE) aqueous dispersion TEFLON PTFE TE-3823 (60% (by total weight) of 0.05 to 0.5 microns PTFE resin particles and formulated with a nonionic wetting agent which burns off at approximately 50° C. lower than traditional surfactants), about 64 grams of Teflon FEP 121 A (54% (by total weight) of 0.1 to 0.3 microns fluorinated ethylene propylene (FEP) resin particles suspended in water) was mixed with 24 grams of spherical silica having an average particle size of 3.8 microns available from Tatsumori under the trade designation PLV-4 and 46 grams of spherical alumina from Admatechs Vo. Ltd. under the trade designation AO-509 under high agitation in a high speed disperser at about 1500 to about 5000 RPM for about 15 to 25 minutes and allowed to equilibrate for 1 to about 2 hours. The composition was then coated from the aqueous dispersion onto a copper substrate to a thickness of about 2.3 mils thick. The coating was then heated to remove water at a temperature of about 100° C. to about 115° C. followed by heating 1 hour at 240° C. to 260° C. to volatilize the surfactant, sintered, and pressed under a pressure of about 1600 PSI to about 2000 PSI for about 65 minutes at about 265° C. to about 350° C. The obtained thickness of the film is about 1.3 to 1.5 mils after the copper is removed by etching. The composite film after fusing has a coefficient of thermal expansion (CTE) in the range of about 52 ppm/° C. to about 70 ppm/° C., a dielectric constant of 2.54 and a composite density of 2.30 g/cc.

EXAMPLE SEVEN

A composition containing about 35 grams of a polytetrafluoroethylene (PTFE) aqueous dispersion TEFLON PTFE TE-3823 (60% (by total weight) of 0.05 to 0.5 microns PTFE resin particles and formulated with a nonionic wetting agent which burns off at approximately 50° C. lower than traditional surfactants), about 46 grams of Teflon PFA 335 (60% (by total weight) of 0.05 to 0.5 microns perfluoroalkoxy (PFA) resin particles suspended in water) and about 76 grams of Teflon FEP 121A (54% (by total weight) of 0.1 to 0.3 microns fluorinated ethylene propylene (FEP) resin particles suspended in water) was mixed per the conditions in Example Six with 58.5 grams of spherical silica having an average particle size of 3.8 microns available from Tatsumori under the trade designation PLV-3 and 29.8 grams of spherical alumina from Admatechs Vo. Ltd. under the trade designation AO-900H. The composition was then coated onto a support substrate such as copper to a thickness of about 2.4 mils thick and processed according to the conditions used in Example Six. The obtained thickness of the film is about 1.3 to 1.6 mils. After the copper is removed by etching in cupric chloride the dry composite film has a coefficient of thermal expansion (CTE) in the range of about 36 ppm/° C. to about 54 ppm/° C. and a composite density of 2.23 g/cc.

TABLE

|  | Range |
|---|---|
| Electrical properties | |
| Dk (dielectric constant) @ 1-2.5 GHz (average) | 2.45-2.97 |
| Loss factor at 1 MHz | 0.0022-0.0037 |
| Physical properties | |
| Water absorption % | 0.04-0.09 |
| Tensile Strength KPa | 5,600-15,000 |
| Elongation % | 50-330 |
| Coefficient of Thermal expansion ppm/° C. | 13.9-79 |
| Melting point (C.) | 240-335 |
| Composite density (g/cc) | 2.14-2.54 |

As further understood from the description herein, a particular use for the circuitized substrate formed herein is as part of a chip carrier or a PCB or other electronic packaging product such as those made and sold by the Assignee of the instant invention. One particular example is a chip carrier sold under the name Hyper-BGA chip carrier (Hyper-BGA being a registered trademark of Endicott Interconnect Technologies, Inc.). The invention is, of course, not limited to chip carriers or even to higher level PCBs. It is also understood that more than one such circuitized substrate (also referred to as a "core", a specific example being what is referred to as a "power core" if the core includes one or more power planes and is thus to serve primarily in this capacity) may be incorporated within such a carrier or PCB, depending on operational requirements desired for the final product. As defined below, the "core" can be readily "stacked up" with other layers, including conductors and dielectric, and bonded together (preferably using conventional PCB lamination processing) to form the multilayered carrier or multilayered PCB. The laminate so formed is then subjected to further processing, including conventional photolithographic processing to form circuit patterns on the outer conductive layers thereof As described hereinbelow, such external patterns can include conductive pads on which conductors such as solder balls can be positioned to connect the structure to other components such as semiconductor chips, PCBs and chip carriers if so desired. The unique teachings of this invention are thus adaptable to a multitude of electronic packaging products.

While there have been shown and described what are at present considered to be the preferred embodiments of the invention, it will be obvious to those skilled in the art that various changes and modifications may be made therein without departing from the scope of the invention as defined by the appended claims.

What is claimed is:

1. A dielectric composition adapted for forming a dielectric layer for use in circuitized substrates, said dielectric composition comprising:

first and second fluoropolymers, said first fluoropolymer having a high melting point from 300 degrees Celsius to 350 degrees Celsius and said second fluoropolymer having a low melting point from 200 degrees Celsius to 280 degrees Celsius; and first and second inorganic fillers, said first inorganic filler having a high thermal conductivity from 600 W/m.K degrees to 2000 W/m.K degrees and said inorganic second filler having a low thermal conductivity from 5 W/m.K degrees to 400 W/m.K degrees, said dielectric layer including said dielectric composition having a dielectric constant of from about 2.8 to about 3.6.

2. The dielectric composition of claim 1 wherein said first and second inorganic fillers include particles having a size no greater than about 10 microns.

3. The dielectric composition of claim 2 wherein said particles are of spherical configuration.

4. The dielectric composition of claim 2 wherein said first and second inorganic fillers are selected from the group consisting of alumina, aluminum oxide, aluminum nitride, silicon nitride, silicon carbide, boron nitride, diamond powder, titanium oxide, silica, ceramic and combinations thereof.

5. The dielectric composition of claim 4 wherein said first and second inorganic fillers are silica, said silica selected from the group consisting of spherical amorphous silica, semi-spherical amorphous silica, hollow silica microspheres and combinations thereof.

6. The dielectric composition of claim 1 wherein said first and second fluoropolymers belong to the polytetrafluoroethylene family and comprise from about 50 to about 90 percent by weight of said composition and said first and second fillers comprise from about 10 to about 50 percent by weight of said composition.

7. The invention of claim 1 wherein said dielectric layer further includes supporting material.

8. The invention of claim 7 wherein said supporting material comprises fiber-glass cloth.

9. The dielectric composition of claim 1 further including a third fluoropolymer having a melting point lower than said high and low melting points of said first and second fluoropolymers, respectively.

10. A circuitized substrate comprising:

at least one dielectric layer including a dielectric composition having first and second fluoropolymers, said first fluoropolymer having a high melting point from 300 degrees Celsius to 350 degrees Celsius and said second fluoropolymer having a low melting point from 200 degrees Celsius to 280 degrees Celsius and first and second inorganic fillers, said first inorganic filler having a high thermal conductivity from 600 W/m.K degrees to 2000 W/m.K degrees and said inorganic second filler having a low thermal conductivity from 5 W/m.K degrees to 400 W/m.K degrees, said dielectric layer including said dielectric composition having a dielectric constant of from about 2.8 to about 3.6; and at least one conductive layer positioned on said at least one dielectric layer.

11. The circuitized substrate of claim 10 wherein said at least one conductive layer is comprised of copper or copper alloy.

12. The circuitized substrate of claim 10 wherein said first and second inorganic fillers include particles having a size no greater than about 10 microns.

13. The circuitized substrate of claim 12 wherein said particles are of spherical configuration.

14. The circuitized substrate of claim 12 wherein said first and second inorganic fillers are selected from the group consisting of alumina, aluminum oxide, aluminum nitride, silicon nitride, silicon carbide, boron nitride, diamond powder, titanium oxide, silica, ceramic and combinations thereof.

15. The circuitized substrate of claim 14 wherein said first and second inorganic fillers are silica, said silica selected from the group consisting of spherical amorphous silica, semi-spherical amorphous silica, hollow silica microspheres and combinations thereof.

16. The circuitized substrate of claim 10 wherein said first and second fluoropolymers belong to the polytetrafluoroethylene family and comprise from about 50 to about 90 percent by weight of said composition and said first and second fillers comprise from about 10 to about 50 percent by weight of said composition.

17. The circuitized substrate of claim 10 wherein said at least one dielectric layer further includes supporting material.

18. The circuitized substrate of claim 17 wherein said supporting material comprises fiber-glass cloth.

19. The circuitized substrate of claim 10 wherein said dielectric composition further includes a third fluoropolymer having a melting point lower than said high and low melting points of said first and second fluoropolymers, respectively.

* * * * *